(12) United States Patent
Lee et al.

(10) Patent No.: US 6,399,272 B1
(45) Date of Patent: Jun. 4, 2002

(54) PHENYLENEDIAMINE DERIVATIVE-TYPE ADDITIVE USEFUL FOR A CHEMICALLY AMPLIFIED PHOTORESIST

(75) Inventors: Geun Su Lee, Kyoungki-do; Cha Won Koh, Seoul; Jae Chang Jung, Kyoungki-do; Min Ho Jung, Kyoungki-do; Ki Ho Baik, Kyoungki-do, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/595,434

(22) Filed: Jun. 15, 2000

(30) Foreign Application Priority Data

Jun. 21, 1999 (KR) ............................................. 99-23211

(51) Int. Cl.$^7$ ................................................ B03F 7/004
(52) U.S. Cl. ..................................... 430/270.1; 564/305
(58) Field of Search ........................ 430/270.1; 564/305

(56) References Cited

U.S. PATENT DOCUMENTS 5,736,557 A * 4/1998 Hofheinz et al. ........... 514/313

OTHER PUBLICATIONS

CA Abstracts AN 1970:445268; DN 73:45268; Adrian, G. et al. Bull.Soc.Chim.Fr. 1970, 4, 1511–14.*

* cited by examiner

*Primary Examiner*—Rosemary Ashton
(74) *Attorney, Agent, or Firm*—Townsend and Townsend and Crew LLP

(57) ABSTRACT

The present invention relates to a phenylenediamine derivative of the formula:

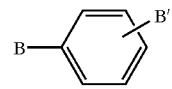

where B and B' are defined herein. The phenylenediamine derivatives of the present invention are useful as an additive in a photoresist composition. For example, it has been found that photoresist. compositions comprising the phenylenediamine derivative of the present invention have a high energy latitude margin, an improved contrast value, and enhanced post exposure delay stability.

24 Claims, 1 Drawing Sheet

PHENYLENEDIAMINE DERIVATIVE-TYPE ADDITIVE USEFUL FOR A CHEMICALLY AMPLIFIED PHOTORESIST

BACKGROUND OF THE INVENTION

1. Field of the Invention

The present invention relates to phenylenediamine derivatives and methods for using the same. In one particular aspect of the present invention, phenylenediamine derivatives of the present invention are used as an additive in chemically amplified photoresist films for increasing the energy latitude (EL) margin, and improving a contrast value and post exposure delay (PED) stability.

2. Description of the Background Art

Use of chemical amplification-type photoresists (i.e., photoresist compositions) is currently being investigated in photolithography processes to achieve a high sensitivity in minute image-formation on semiconductor devices. Such photoresists are generally prepared by blending a photoacid generator with a matrix resin polymer (i.e., photoresist polymer) having an acid labile group.

In a photolithography process for producing semiconductor devices, the resolution of an image depends on the wavelength of the light used. Thus, the shorter the wavelength, higher the resolution, i.e., shorter wavelengths allow smaller pattern formation.

In order to be useful in a photolithography process, a photoresist (PR) must have an excellent etching and heat resistance, and adhesiveness. Moreover, to reduce the cost of manufacturing semiconductor devices, a PR should be capable of being developed by a common developing solution, such as a 2.38 wt % aqueous tetramethylammonium hydroxide (TMAH) solution. These qualities are particularly important in photolithography processes utilizing a deep ultraviolet light source (i.e., short wavelength light source), including KrF (248 nm), ArF (193 nm) and EUV.

While it is difficult to synthesize a photoresist polymer that satisfies all of these requirements, a variety of photoresist polymers with improved etching resistance, adhesiveness and resolution have been developed. Unfortunately, however, most chemically-amplified photoresists currently available have a relatively short post exposure delay (PED) stability. In general, when there is delay between exposure of the photoresist to light and development of the exposed photoresist, acids that are generated on the exposed area are neutralized by amine compounds which may be present in the production atmosphere. Since the pattern formation depends on acids that are generated by the exposure, neutralization of acids by atmospheric amine compounds reduce, prevent or alter a pattern formation, e.g, a T-topping phenomenon may occur where the top portion of the pattern forms a T-shape.

In theory, one may overcome the aforementioned disadvantages by improving the photoresist polymer or by adding an additive to improve the PED stability of the photoresist composition. In the conventional art, various amine compounds, in particular amine compounds that are weakly basic and/or have bulky groups have been employed as an additive to increase the PED stability. However, most of these additives dissolve relatively equally well in the exposed and unexposed regions. In addition, most of these additives are relatively volatile liquids which escape into the atmosphere during the post exposure delay; therefore, photoresists containing these amine compounds have poor reproducibility. Furthermore, since these amine compounds are volatile, it is difficult to control the precise amount of these additives present in the photoresist during a photolithiography process.

Therefore, there is a need for a photoresist additive compound which overcomes the above-mentioned disadvantages.

SUMMARY OF THE INVENTION

It is therefore an object of the present invention to provide a photoresist additive compound which increases the PED stability of a photoresist.

It is also an object of the present invention to provide a photoresist additive compound which increases the energy latitude (EL) margin and improves the contrast value of the photoresist.

In order to achieve the above-described objectives, the present invention provides novel phenylenediamine derivatives. Without being bound by any theory, it is believed that phenylenediamine derivatives of the present invention improve PED stability of a photoresist by preventing or reducing the number of contacts between the acid that is generated on the exposed area and environmental amine compounds.

DETAILED DESCRIPTION OF THE PREFERRED EMBODIMENTS

Figure 1:
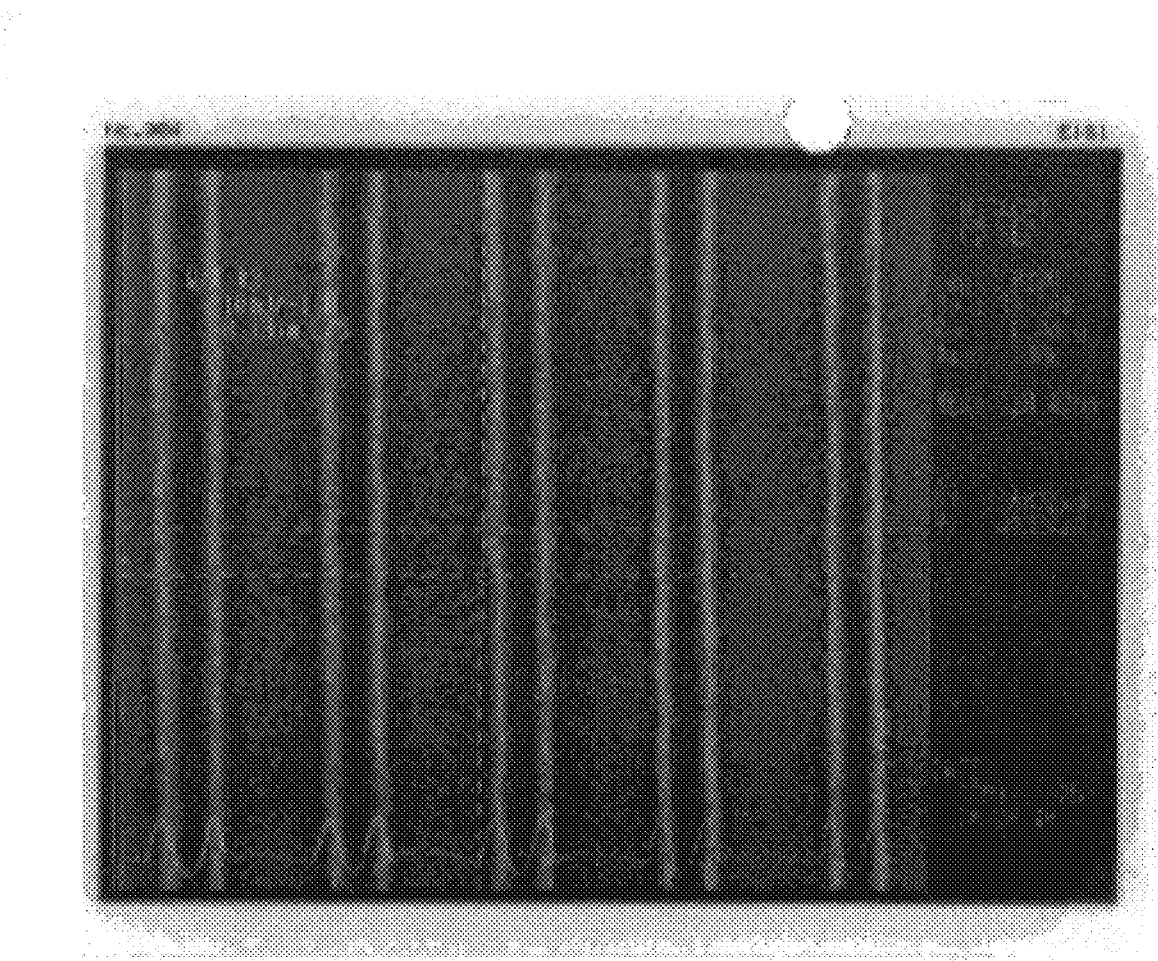
FIG. 1 is a CD-SEM photograph of a silicon wafer coated with a photoresist composition that includes a phenylenediamine derivative of the present invention as an additive. The silicon wafer was exposed to light and left standing for 30 minutes to simulate post exposure delay.

The present invention provides phenylenediamine derivatives that are useful as additives for chemically amplified photoresist. In particular, the present invention provides a phenylenediamine derivative of the following formula:

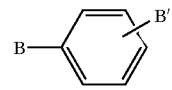

1 wherein
B is

B' is

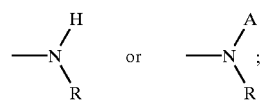

each R is independently H, or $C_1$–$C_{10}$ alkyl; and
A is a protecting group. Preferably, A is an acid-labile protecting group. Alternatively, A is a protecting group which is soluble in an alkali developing solution when it is removed (i.e., deprotected) from Compound 1, i.e., when the protecting group A is removed from Compound 1, the resulting protecting group that is removed is hydrophilic and is soluble in the developing solution.

In a photoresist composition comprising Compound 1 as an additive, it is preferred that the protecting group of Compound 1 is removed from at least a portion of the composition by the acid that is generated during the lithiography process.

In one particular aspect of the present invention, A is selected from the group consisting of tetrahydropyran-2-yl; alkyl substituted tetrahydropyran-2-yl; tetrahydrofuran-2-yl; alkyl substituted tetrahydrofuran-2-yl; alkoxyalkyl; alkoxycarbonyl; and acetylmenthyl. Preferably, A is selected from the group consisting of tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl, tert-butoxycarbonyl, and 2-acetylmenth-1-yl.

The present inventor have found that the addition of Compound 1 to a photoresist composition improves the PED stability of the photoresist composition. Furthermore, it has been found by the present inventors that the addition of Compound 1 provides a photoresist composition having a useful EL margin and an increased contrast value.

In general, Compound 1 is sterically bulky and weakly basic. Without being bound by any theory, in a photoresist containing Compound 1, as illustrated in Scheme 1, it is believed that Compound 1 provides a buffer action by holding/releasing the acid generated at the exposed region. As a result, Compound 1 efficiently prevents the acid from being contacted with the environmental amine compounds, thereby contributing to the PED stability.

Scheme 1

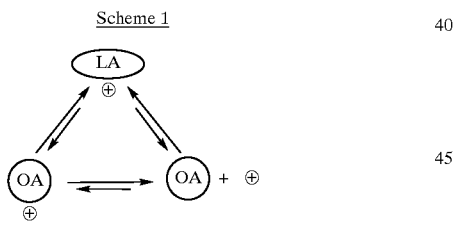

In Scheme 1, OA represents Compound 1; LA represents amine on the production line; and ⊕ denotes the acid generated from the photoacid generator by exposure.

Relatively speaking, Compound 1 does not dissolve in the unexposed area, but dissolves readily in the exposed area. It is believed that the improved pattern profile of a photoresist comprising Compound 1 is due to this difference in solubility of Compound 1. In addition, unlike currently available amine additive compounds, Compound 1 is a solid having a high melting point and a low vapor pressure; therefore, it does not volatilize during the post exposure delay, thereby resulting in a reliable reproducibility.

Representative examples of Compound 1, which are particularly useful as photoresist additives are compounds 2–19 shown below:

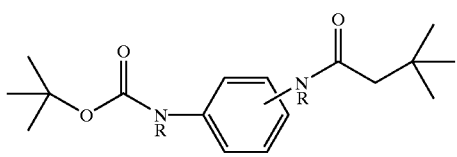

2

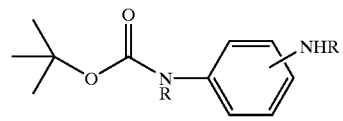

3

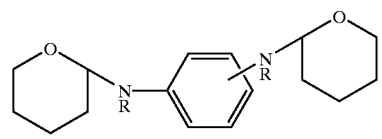

4

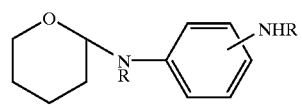

5

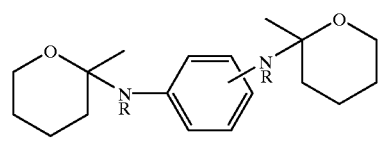

6

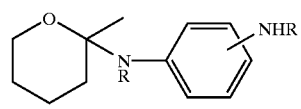

7

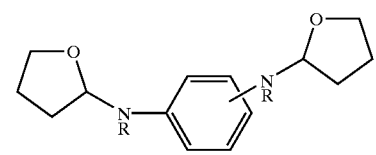

8

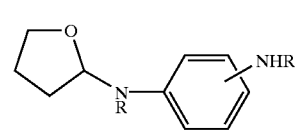

9

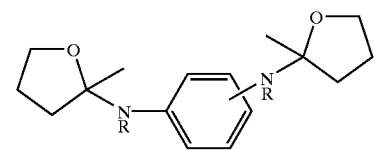

10

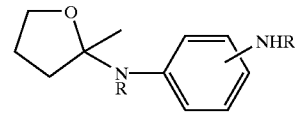

11

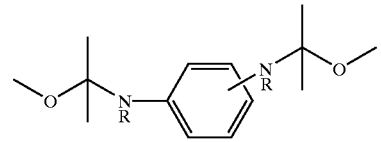

12

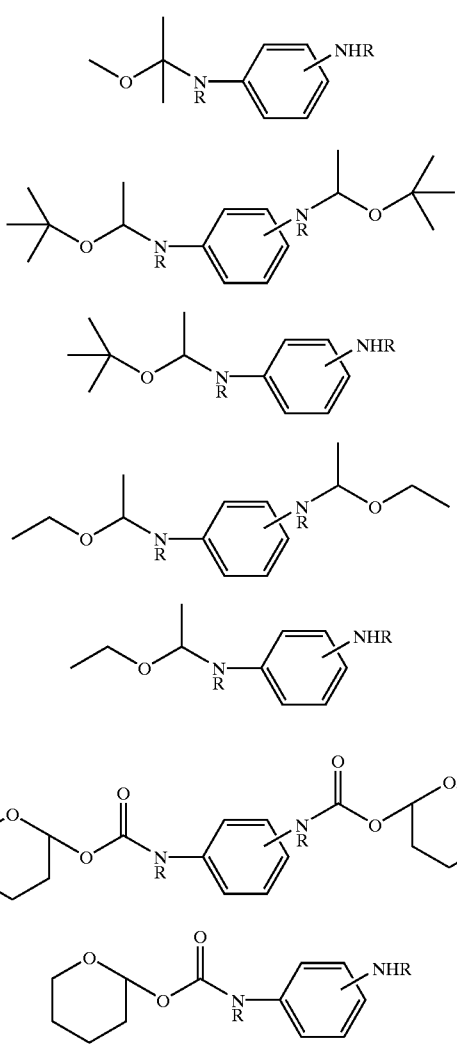

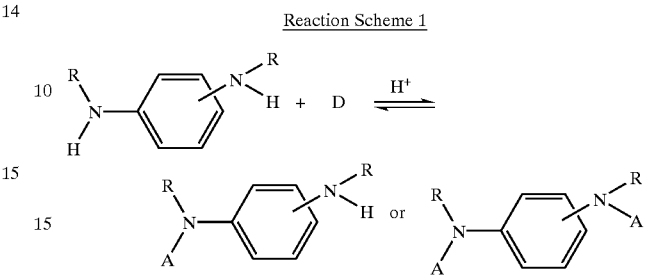

In Reaction Scheme 1, R and A are those defined above.

Preferably, the protecting group precursor D is selected from compounds of formulas 20–33, which corresponds to 3,4-dihydro-2H-pyran, 2-methyl-3,4-dihydro-2H-pyran, 2,3-dihydrofuran, 5-methyl-2,3-dihydrofuran, 1-methoxyprop-1-ene, 2-methoxyprop-1-ene, 1-ethoxyprop-1-ene, 2-ethoxyprop-1-ene, methyl vinyl ether, ethyl vinyl ether, tert-butyl vinyl ether, isobutyl vinyl ether, di-tert-butyl dicarbonate, and 2-acetylmenth-1-ene, respectively:

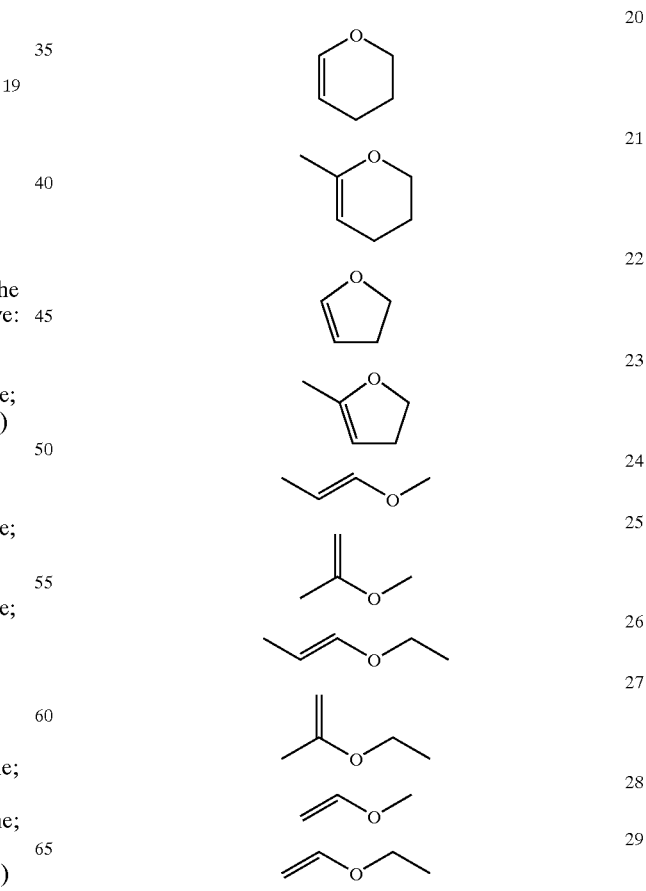

where R is same as described above.

In addition, following compounds compound of the present invention may also be used as a photoresist additive:

N,N'-di-(1-methoxypropyl)phenylenediamine;
N,N'-diethyl-N,N'-di-(1-methoxypropyl)phenylenediamine;
N,N'-dimethyl-N,N'-di-(1-methoxypropyl)phenylenediamine;
N,N'-di-(1-ethoxypropyl)phenylenediamine;
N,N'-diethyl-N,N'-di-(1-ethoxypropyl)phenylenediamine;
N,N'-dimethyl-N,N'-di-(1-ethoxypropyl)phenylenediamine;
N,N'-di-(2-ethoxypropyl)phenylenediamine;
N,N'-diethyl-N,N'-di-(2-ethoxypropyl)phenylenediamine;
N,N'-dimethyl-N,N'-di-(2-ethoxypropyl)phenylenediamine;
N,N'-di-(methoxyethyl)phenylenediamine;
N,N'-diethyl-N,N'-di-(methoxyethyl)phenylenediamine;
N,N'-dimethyl-N,N'-di-(methoxyethyl)phenylenediamine;
N,N'-di-(iso-butoxyethyl)phenylenediamine;
N,N'-diethyl-N,N'-di-(iso-butoxyethyl)phenylenediamine;
N,N'-dimethyl-N,N'-di-(iso-butoxyethyl)phenylenediamine;
N,N'-di-(acetylmenth-1-yl)phenylenediamine;
N,N'-diethyl-N,N'-di-(acetylmenth-1-yl)phenylenediamine; and
N,N'-dimethyl-N,N'-di-(acetylmenth-1-yl)phenylenediamine.

-continued

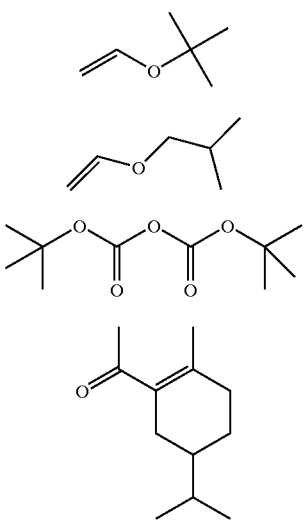

In addition, when at least one R is H in the product of Reaction Scheme 1, the product of Reaction Scheme 1 can be further alkylated using an alkyl group containing a leaving group. Useful leaving groups are well known to one of ordinary skill in the art and include halides, tosylates, and mesylates. Preferably, an alkylating group is an alkyl halide, more preferably alkyl iodides, and most preferably iodomethane or iodoethane. The alkylation of the product of Reaction Scheme 1 is illustrated in Reaction Scheme 2 below, where A and R are those defined above.

Reaction Scheme 2

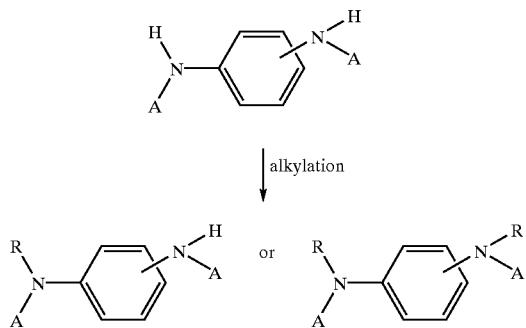

Another embodiment of the present invention provides a photoresist composition comprising a photoresist resin (e.g., polymer), an organic solvent, a photoacid generator, and Compound 1 as an additive for enhancing the PED stability.

The photoresist resin can be any currently known chemically amplified photoresist resins, preferably a resin comprising maleic anhydride, for example, poly(2-hydroxyethyl 5-norbornene-2-carboxylic acid/t-butyl 5-norbornene-2-carboxylate/5-norbornene-2-carboxylic acid/maleic anhydride).

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenyl- sulfonium hexafluoroarsenate, triphenylsulfonium hexafluoroantimonate, triphenylsulfonium triflate and dibutylnaphthylsulfonium triflate. Typically, the amount of photoacid generator used is from about 0.05% by weight to about 10% by weight of the photoresist resin present in the composition.

The amount of Compound I present in the photoresist composition can be typically from about 1% by weight to about 50% by weight of the photoacid generator, preferably preferably from about 5% by weight to about 30% by weight of the photoacid generator. Unless otherwise stated, the amount of each components present in the photoresist composition refers to the amount of each components added. It should be appreciated that the actual amount of each components may change during the lithography process.

While a variety of organic solvents are suitable for use in the photoresist composition of the present invention, preferably the organic solvent is selected from the group consisting of methyl 3-methoxypropionate, ethyl 3-ethoxypropionate, propylene glycol methyl ether acetate, cyclohexanone, 2-heptanone and (2-methoxy)ethyl acetate. The amount of organic solvent used in the photoresist composition is preferably from about 200% by weight to about 1000% by weight of the photoresist resin.

The photoresist composition of the present invention is typically prepared by dissolving the photoresit resin (i.e., polymer) in the amount of from about 10% by weight to about 30% by weight of an organic solvent, admixing (e.g., blending) the photoacid generator in the amount of from about 0.05% by weight to about 10% by weight of the polymer, adding the additive (i.e., Compound 1) in the amount of from about 1% by weight to about 50% by weight of the photoacid generator, and filtering the resulting mixture through an ultramicro filter. It should be appreciated that the order of adding individual components may be changed without any significant adverse effect.

It has been discovered by the present inventors that by having Compound I, photoresist compositions of the present invention have a longer PED stability relative to the same composition without Compound I. Moreover, photoresist compositions of the present invention have the EL margin and an increased contrast value. Therefore, photoresist compositions of the present invention are suitable as an ArF photoresist.

Another embodiment of the present invention provides a process for producing a photoresist pattern comprising the steps of:

(a) coating a photoresist composition on a substrate to form a photoresist film, wherein the photoresist composition comprises a photoresist resin, an organic solvent, a photoacid generator and an additive capable of improving post exposure delay stability and a contrast value;

(b) exposing the photoresist film to light by using an exposer; and (c) developing the exposed photoresist film.

The process for producing the photoresist pattern can also comprise heating (e.g., baking) step(s) before and/or after exposing the photoresist film to light. The baking step is typically performed at temperature of about 70° C. to about 200° C.

As used herein, the term "light" refers to an electromagnetic wave generated by the exposer and not by an ambient light source, unless otherwise stated. Preferably, the exposer is a deep ultraviolet (DUV), i.e., short wavelength, light source such as ArF, KrF, EUV, E-beam, X-ray, ion beam, or combinations thereof. The exposure energy is preferably from about 1 mJ/cm$^2$ to about 100 mJ/cm$^2$.

Processes for producing a photoresist pattern typically involves spin-coating the photoresist composition of the present invention on a silicon wafer to produce a coated wafer, and "soft-baking" the coated wafer (e.g., in an oven or on a hot-plate) at a temperature of from about 80° C. to about 150° C., for about 1 to 5 minutes. The photoresist layer is then exposed to from about 0.1 mJ/cm$^2$ to about 100 mJ/cm$^2$ of light energy using an exposer, and "post-baked" at a temperature of from about 100° C. to about 200° C. The resulting post-baked wafer is developed by dipping it into an alkaline developing solution, e.g., a solution containing from about 0.01% by weight to about 5% by weight of TMAH (tetramethylammonium hydroxide), for a predetermined time, preferably about 90 seconds, to obtain an ultramicro photoresist pattern. Typically a solution containing about 2.38% by weight of TMAH is used as the developing solution.

Yet another embodiment of the present invention provides a semiconductor element that is manufactured using the photoresist composition described above.

The present invention will now be described in more detail by referring to the examples below, but it should be noted that the present invention is not restricted to these examples. For example, in addition to 1,4-phenylenediamine which is used in the examples, other phenylenediamines such as 1,3-phenylenediamine and 1,2-phenylenediamine can be employed.

I. Preparation of Additive

EXAMPLE 1

Synthesis of N,N'-di-(tert-butylcarbonyl) phenylenediamine

About 0.1 mole of phenylenediamine and about 0.2 mole of di-tert-butyldicarbonate (Compound 32) were dissolved in about 300 mL of dry tetrahydrofuran. The resulting mixture was stirred at room temperature for about 10 hours, and the solvent (THF) was removed by distillation. The residue was diluted with about 300 mL of methanol, heated and cooled to produce a white solid precipitate, which was filtered and dried to yield N,N'-di-(tert-butylcarbonyl)phenylenediamine (R is H in Compound 2) as a white solid (yield 97%).

EXAMPLE 2

Synthesis of N,N'-diethyl-N,N'-di-(tert-butylcarbonyl)phenylenediamine

About 0.1 mole of N,N'-di-(tert-butylcarbonyl) phenylenediamine, prepared using Example 1, was dissolved in about 300 mL of the dry THF. To this mixture was added about 0.2 mole of NaH. The resulting mixture was stirred at room temperature for 30 minutes, and about 0.2 mole of iodoethane was slowly added. This mixture was stirred at room temperature for about 10 hours. The reaction mixture was concentrated (e.g., by removing the solvent via distillation), diluted with about 300 mL of ethyl acetate and extracted with about 300 mL of water. The organic layer was separated, dried over MgSO$_4$, filtered and concentrated to yield N,N'-diethyl-N,N'-di-(tert-butylcarbonyl)-phenylenediamine (R is ethyl in Compound 2) as a light yellow oil (yield 89%).

EXAMPLE 3

Synthesis of N,N'-dimethyl-N,N'-di-(tert-butylcarbonyl)phenylenediamine

N,N'-dimethyl-N,N'-di-(tert-butylcarbonyl) phenylenediamine (R is methyl in Compound 2) was prepared using the procedure of Example 2 by substituting iodomethane for iodoethane (yield 90%).

EXAMPLE 4

Synthesis of N,N'-di-(tetrahydropyran-2-yl) phenylenediamine

About 0.1 mole of phenylenediamine, three drops (about 0.1 ml) of sulfuric acid and about 0.2 mole of dihydropyran (Compound 20) were dissolved in dry tetrahydrofuran and stirred at room temperature for about 10 hours. The resulting mixture was concentrated, diluted with 300 mL of methanol, heated and cooled to produce a white solid precipitate, which was filtered and dried to yield N,N'-di-(tetrahydropyran-2-yl)phenylenediamine (R is H in Compound 4) as a white solid (yield 97%).

EXAMPLE 5

Synthesis of N,N'-diethyl-N,N'-di-[(tetrahydropyran-2-yl)carboxylate] phenylenediamine About 0.1 mole of N,N'-di-[(tetrahydropyran-2-yl) carboxylate]phenylenediamine was dissolved in about 300 mL of dry THF. To this mixture was added about 0.2 mole of NaH, and the resulting mixture was stirred at room temperature for about 30 minutes. About 0.2 mole of iodoethane was slowly added to the resultant mixture and stirred at room temperature for about 10 hours. The reaction mixture was concentrated by distillation, diluted with about 300 mL of ethyl acetate and extracted with about 300 mL of water. The organic layer was separated, dried over MgSO$_4$, filtered and concentrated to yield N,N'-diethyl-N,N'-di-[(tetrahydropyran-2-yl)carboxylate]phenylenediamine (R is ethyl in compound 18) as a light yellow oil (yield 89%).

EXAMPLE 6

Synthesis of N,N'-dimethyl-N,N'-di-[(tetrahydropyran-2-yl)carboxylate] phenylenediamine N,N'-dimethyl-N,N'-di-[(tetrahydropyran-2-yl) carboxylate]phenylenediamine (R is methyl in compound 18) was prepared using the procedure of Example 5 by substituting iodomethane for iodoethane (yield 90%).

EXAMPLE 7

Synthesis of N,N'-di-(1-methoxypropyl) phenylenediamine

The title compound was prepared using the procedure of Example 1 by substituting methoxypropene (compound 24) for di-tert-butyl dicarbonate (compound 32).

EXAMPLE 8

Synthesis of N,N'-diethyl-N,N'-di-(1-methoxypropyl)phenylenediamine

Using the procedure of Example 2, the title compound was prepared by ethylating the compound prepared by the process of Example 7.

EXAMPLE 9

Synthesis of N,N'-dimethyl-N,N'-di-(1-methoxypropyl)phenylenediamine

Using the procedure of Example 3, the title compound was prepared by methylating the compound prepared by the process of Example 7.

EXAMPLE 10

Synthesis of N,N'-di-(2-methoxypropyl) phenylenediamine

The title compound (R is H in compound 12) was prepared using the procedure of Example 1 by substituting 2-methoxypropene (compound 25) for di-tert-butyl dicarbonate (compound 32).

EXAMPLE 11

Synthesis of N,N'-diethyl-N,N'-di-(2-methoxypropyl)phenylenediamine

Using the procedure of Example 2, the title compound (R is ethyl in compound 12) was prepared by ethylating the compound prepared by the process of Example 10.

EXAMPLE 12

Synthesis of N,N'-dimethyl-N,N'-di-(2-methoxypropyl)phenylenediamine

Using the procedure of Example 3, the title compound (R is methyl in compound 12) was prepared by methylating the compound prepared by the process of Example 10.

EXAMPLE 13

Synthesis of N,N'-di-(1-ethoxypropyl) phenylenediamine

The title compound was prepared using the procedure of Example 1 by substituting ethoxypropene (compound 26) for di-tert-butyl dicarbonate (compound 32).

EXAMPLE 14

Synthesis of N,N'-diethyl-N,N'-di-(1-ethoxypropyl) phenylenediamine

Using the procedure of Example 2, the title compound was prepared by ethylating the compound prepared by the process of Example 13.

Example 15

Synthesis of N,N'-dimethyl-N,N'-di-(1-ethoxypropyl)phenylenediamine

Using the procedure of Example 3, the title compound was prepared by methylating the compound prepared by the process of Example 13.

EXAMPLE 16

Synthesis of N,N'-di-(2-ethoxypropyl) phenylenediamine

The title compound was prepared using the procedure of Example 1 by substituting 2-ethoxypropene (compound 27) for di-tert-butyl dicarbonate (compound 32).

EXAMPLE 17

Synthesis of N,N'-diethyl-N,N'-di-(2-ethoxypropyl) phenylenediamine

Using the procedure of Example 2, the title compound was prepared by ethylating the compound prepared by the process of Example 16.

EXAMPLE 18

Synthesis of N,N'-dimethyl-N,N'-di-(2-ethoxypropyl)phenylenediamine

Using the procedure of Example 3, the title compound was prepared by methylating the compound prepared by the process of Example 16.

EXAMPLE 19

Synthesis of N,N'-di-(methoxyethyl) phenylenediamine

The title compound was prepared using the procedure of Example 1 by substituting methyl vinyl ether (compound 28) for di-tert-butyl dicarbonate (compound 32).

EXAMPLE 20

Synthesis of N,N'-diethyl-N,N'-di-(methoxyethyl) phenylenediamine

Using the procedure of Example 2, the title compound was prepared by ethylating the compound prepared by the process of Example 19.

EXAMPLE 21

Synthesis of N,N'-dimethyl-N,N'-di-(methoxyethyl) phenylenediamine

Using the procedure of Example 3, the title compound was prepared by methylating the compound prepared by the process of Example 19.

EXAMPLE 22

Synthesis of N,N'-di-(tert-butoxyethyl) phenylenediamine

The title compound (R is H in compound 14) was prepared using the procedure of Example 1 by substituting tert-butyl vinyl ether (compound 30) for di-tert-butyl dicarbonate (compound 32).

EXAMPLE 23

Synthesis of N,N'-diethyl-N,N'-di-(tert-butoxyethyl) phenylenediamine

Using the procedure of Example 2, the title compound (R is ethyl in compound 14) was prepared by ethylating the compound prepared by the process of Example 22.

EXAMPLE 24

Synthesis of N,N'-dimethyl-N,N'-di-(tert-butoxyethyl)phenylenediamine

Using the procedure of Example 3, the title compound (R is methyl in compound 14) was prepared by methylating the compound prepared by the process of Example 22.

EXAMPLE 25

Synthesis of N,N'-di-(iso-butoxyethyl) phenylenediamine

The title compound was prepared using the procedure of Example 1 by substituting iso-butyl vinyl ether (compound 31) for di-tert-butyl dicarbonate (compound 32).

EXAMPLE 26

Synthesis of N,N'-diethyl-N,N'-di-(iso-butoxyethyl) phenylenediamine

Using the procedure of Example 2, the title compound was prepared by ethylating the compound prepared by the process of Example 25.

EXAMPLE 27

Synthesis of N,N'-dimethyl-N,N'-di-(iso-butoxyethyl)phenylenediamine

Using the procedure of Example 3, the title compound was prepared by methylating the compound prepared by the process of Example 25.

EXAMPLE 28

Synthesis of N,N'-di-(ethoxyethyl) phenylenediamine

The title compound (R is H in compound 16) was prepared using the procedure of Example 1 by substituting ethyl vinyl ether (compound 29) for di-tert-butyl dicarbonate (compound 32).

EXAMPLE 29

Synthesis of N,N'-diethyl-N,N'-di-(ethoxyethyl) phenylenediamine

Using the procedure of Example 2, the title compound (R is ethyl in compound 16) was prepared by ethylating the compound prepared by the process of Example 28.

EXAMPLE 30

Synthesis of N,N'-dimethyl-N,N'-di-(ethoxyethyl) phenylenediamine

Using the procedure of Example 3, the title compound (R is methyl in compound 16) was prepared by methylating the compound prepared by the process of Example 28.

EXAMPLE 31

Synthesis of N,N'-di-(2-acetylmenth-1-yl) phenylenediamine

The title compound was prepared using the procedure of Example 1 by substituting 2-acetylmenth-1-ene (compound 33) for di-tert-butyl dicarbonate (compound 32).

EXAMPLE 32

Synthesis of N,N'-diethyl-N,N'-di-(2-acetylmenth-1-yl)phenylenediamine

Using the procedure of Example 2, the title compound was prepared by ethylating the compound prepared by the process of Example 31.

EXAMPLE 33

Synthesis of N,N'-dimethyl-N,N'-di-(2-acetylmenth-1-yl)phenylenediamine

Using the procedure of Example 3, the title compound was prepared by methylating the compound prepared by the process of Example 31.

EXAMPLE 34

Synthesis of N,N'-di-(2-methyltetrahydropyran-2-yl) phenylenediamine

The title compound (R is H in compound 6) was prepared using the procedure of Example 1 by substituting 2-methyl-3,4-dihydro-2H-pyran (compound 21) for di-tert-butyl dicarbonate (compound 32).

EXAMPLE 35

Synthesis of N,N'-diethyl-N,N'-di-(2-methyltetrahydropyran-2-yl)phenylenediamine Using the procedure of Example 2, the title compound (compound 6, R=ethyl) was prepared by ethylating the compound prepared by the process of Example 34.

EXAMPLE 36

Synthesis of N,N'-dimethyl-N,N'-di-(2-methyltetrahydropyran-2-yl)phenylenediamine Using the procedure of Example 3, the title compound (compound 6, R=methyl) was prepared by methylating the compound prepared by the process of Example 34.

EXAMPLE 37

Synthesis of N,N'-di-(tetrahydrofuran-2-yl) phenylenediamine

The title compound (R is H in compound 8) was prepared using the procedure of Example 1 by substituting 2,3-dihydrofuran (compound 22) for di-tert-butyl dicarbonate (compound 32).

EXAMPLE 38

Synthesis of N,N'-diethyl-N,N'-di-(tetrahydrofuran-2-yl)phenylenediamine

Using the procedure of Example 2, the title compound (compound 8, R=ethyl) was prepared by ethylating the compound prepared by the process of Example 37.

EXAMPLE 39

Synthesis of N,N'-dimethyl-N,N'-di-(tetrahydrofuran-2-yl)phenylenediamine

Using the procedure of Example 3, the title compound (compound 8, R=methyl) was prepared by methylating the compound prepared by the process of Example 37.

EXAMPLE 40

Synthesis of N,N'-di-(2-methyltetrahydrofuran-2-yl) phenylenediamine

The titled compound (R is H in compound 10) was prepared using the procedure of Example 1 by substituting 5-methyl-2,3-dihydrofuran (compound 23) for di-tert-butyl dicarbonate (compound 32).

EXAMPLE 41

Synthesis of N,N'-diethyl-N,N'-di-(2-methyltetrahydrofuran-2-yl)phenylenediamine Using the procedure of Example 2, the title compound (compound 10, R=ethyl) was prepared by ethylating the compound prepared by the process of Example 40.

EXAMPLE 42

Synthesis of N,N'-dimethyl-N,N'-di-(2-methyltetrahydrofuran-2-yl)phenylenediamine Using the procedure of Example 3, the title compound (compound 10, R=methyl) was prepared by methylating the compound prepared by the process of Example 40.

II. Preperation of Photoresist Composition

EXAMPLE 43

About 1 g of poly(2-hydroxyethyl 5-norbornene-2-carboxylic acid/t-butyl 5-norbornene-2-carboxylate/5-norbornene-2-carboxylic acid/maleic anhydride) as a photoresist resin, about 5 g of ethyl-3-ethoxypropionate, about 0.012 g of triphenylsulfonium triflate, and about 0.012 g of N,N'-diethyl-N,N'-di-(tert-butylcarbonyl)phenylenediamine, prepared using the procedure of Example 2, were combined and stirred. The resulting mixture was filtered through a micro-filter to produce the photoresist composition.

EXAMPLE 44

The photoresist composition was prepared using the procedure of Example 43 and substituting the additive prepared using the procedure of Example 1 for the additive prepared using the procedure of Example 2.

EXAMPLES 45 TO 84

Photoresist compositions were prepared using the procedure of Example 43 and substituting the additive prepared using the procedure of Examples 3 to 42, respectively, for the additive prepared prepared using the procedure of Example 2.

III. Preparation of Photoresist Pattern and Experiments of PED Stability

All the pattern formation experiments are performed under conditions where the environmental amine concentration is greater than 15 parts per billion (ppb).

EXAMPLE 85

A photoresist composition prepared using the procedure of Example 43 was spin-coated on a silicon wafer. The coated-wafer was exposed to light using an ArF laser exposer, left standing for 30 minutes on a production line to determine the increased PED stability of the photoresist composition, and baked at 110° C. for 90 minutes. The baked-wafer was developed in TMAH developer using a conventional mask to produce a clean 130 nm L/S pattern (See FIG. 1).

Comparative Example 1

The experimental procedure of Example 85 was performed using a photoresist composition without any phenylenediamine derivative additive. The photoresist composition used in this comparative experiment comprised about 1 g of an ArF photoresist polymer (polymer comprising maleic anhydride and an alicyclic monomer), about 5 g of ethyl-3-ethoxypropionate and about 0.012 g of triphenylsulfonium triflate. Similar to Example 43, the mixture was filtered through a micro-filter prior to its coating on to a silicon wafer. A lithiography process using the procedure of Example 85 failed to produce a pattern on the coated-wafer.

Comparative Example 2

The experiment of Example 85 was repeated using a photoresist composition comprising a different amine compound as an additive instead of a phenylenediamine derivative of Compound 1. A lithiography process failed to produce a pattern on the coated-wafer.

As the above examples show, when there is a post-exposure delay for a substrate comprising a photoresist composition that lacks phenylenediamine compound of the present invention or has an amine additive that is different than the compound of the present invention no pattern is formed on the substrate. However, in cases where the substrate is coated with a photoresist composition comprising a phenylenediamine derivative of the present invention, the 130 nm L/S pattern is cleanly formed even when there is a post-exposure delay prior to developing the substrate.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A photoresist composition comprising a photoresist polymer and a post exposure delay stabilizer additive of the formula:

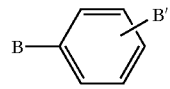

wherein

B is

B' is

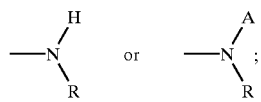

each R is independently H, or $C_1$–$C_{10}$ alkyl; and

A is a protecting group.

2. The photoresist composition of claim 1, wherein A is selected from the group consisting of tetrahydropyran-2-yl; alkyl substituted tetrahydropyran-2-yl; tetrahydrofuran-2-yl; alkyl substituted tetrahydrofuran-2-yl; alkoxyalkyl; alkoxycarbonyl; and acetylmenthyl.

3. The photoresist composition of claim 1, wherein A is selected from the group consisting of tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl, tert-butoxycarbonyl, and 2-acetylmenth-1-yl.

4. The photoresist composition of claim 1, wherein said PED stabilizer additive is selected from the group consisting of compounds of the formulas:

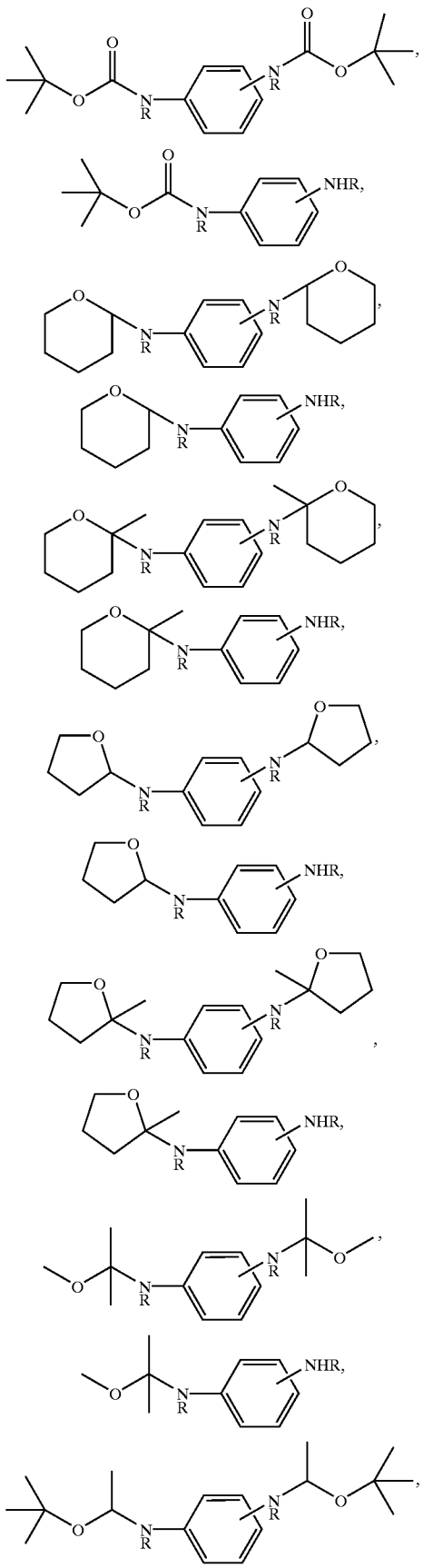
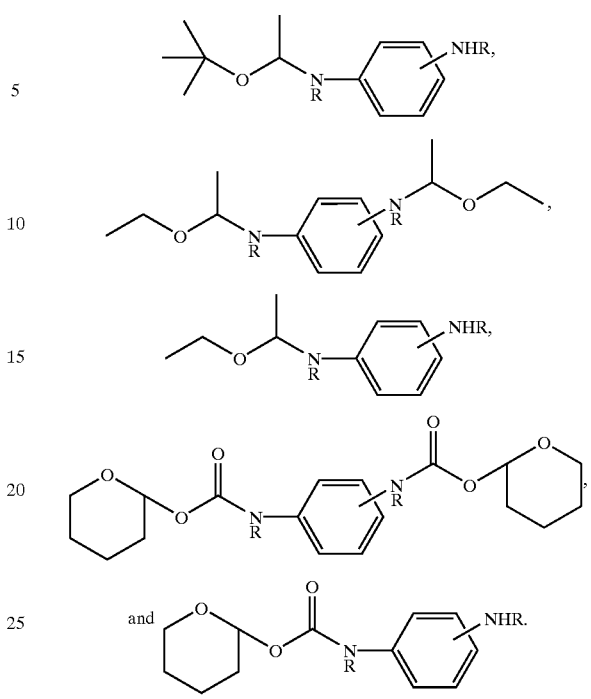
5. A photoresist composition comprising a photoresist resin, an organic solvent, a photoacid generator and an additive of claim 1.
6. A The photoresist composition of claim 5, wherein the additive is selected from the group consisting of compounds of the formulas:
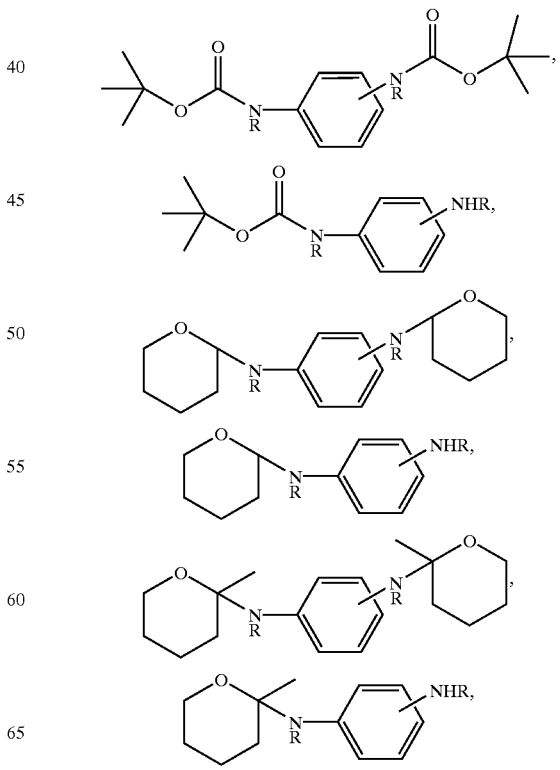

-continued

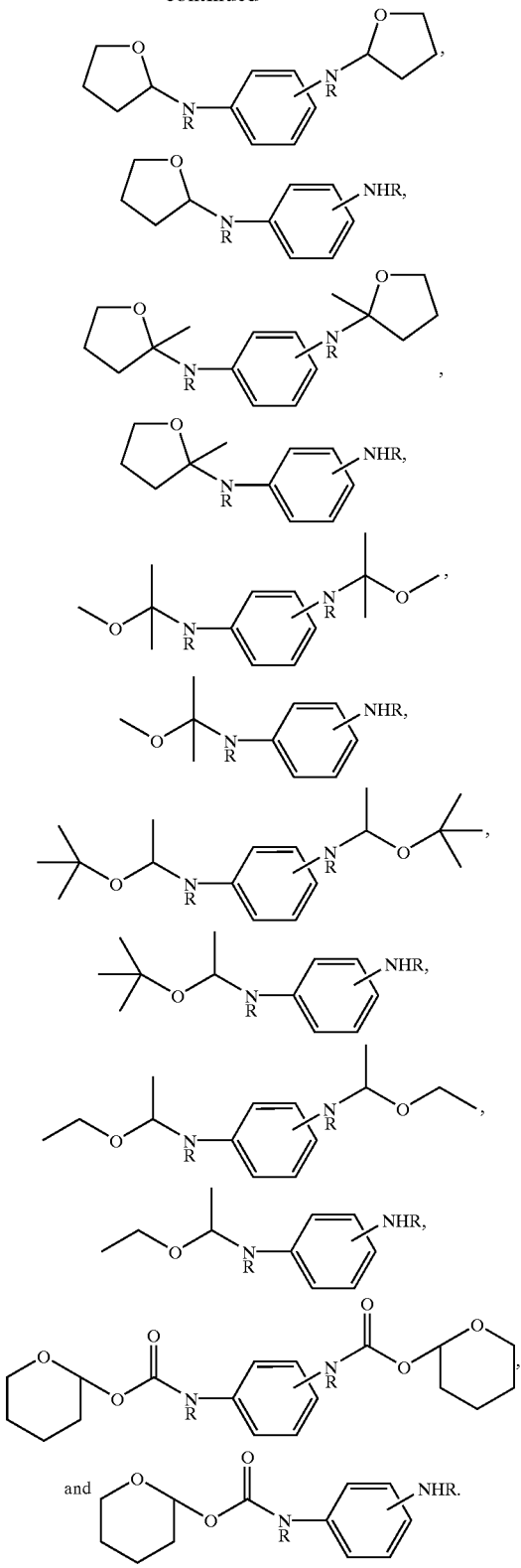

and 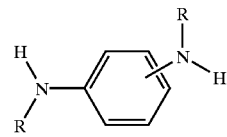

7. The photoresist composition according to claim 5, wherein the photoresist resin comprises chemically amplified photoresist resins.

8. The photoresist composition according to claim 7, wherein the photoresist resin comprises maleic anhydride.

9. The photoresist composition according to claim 5, wherein the photoacid generator is a sulfide or onium type compound.

10. The photoresist composition according to claim 5, wherein the photoacid generator comprises a compound selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate, or mixtures thereof.

11. The photoresist composition according to claim 5, wherein the photoacid generator comprises from about 0.05% by weight to about 10% by weight of the photoresist resin.

12. The photoresist composition according to claim 5, wherein the additive comprises from about 1% by weight to about 50% by weight of the photoacid generator.

13. The photoresist composition according to claim 5, wherein the organic solvent is selected from the group consisting of methyl 3-methoxypropionate, ethyl 3-ethoxypropionate, propylene glycol methyl ether acetate, cyclohexanone, 2-heptanone, (2-methoxy)ethyl acetate, and mixtures thereof.

14. The photoresist composition according to claim 5, wherein the organic solvent comprises from about 200% by weight to about 1000% by weight of the photoresist resin.

15. A process for preparing an alkylated PED stabilizer additive of claim 1, where at least one R is $C_1$–$C_{10}$ alkyl, said process comprising:

(a) contacting a phenylenediamine of the formula with a protecting group precursor in the presence of an acid or a base under conditions sufficient to produce the phenylenediamine derivative; and (b) alkylating the phenylenediamine derivative by contacting the phenylenediamine derivative with an alkylating agent under conditions sufficient to produce the alkylated phenylenediamine.

16. The process according to claim 15, wherein the protecting group precursor is selected from the group consisting of 3,4-dihydro-2H-pyran, 2-methyl-3,4-dihydro-2H-pyran, 2,3-dihydrofuran, 5-methyl-2,3-dihydrofuran, 1-methoxyprop-1-ene, 2-methoxyprop-1-ene, 1-ethoxyprop-1-ene, 2-ethoxyprop-1-ene, methyl vinyl ether, ethyl vinyl ether, tert-butyl vinyl ether, isobutyl vinyl ether, di-tert-butyl dicarbonate, and 2-acetylmenth-1-ene.

17. The process according to claim 15, wherein the alkylating agent is an alkyl halide.

18. The process according to claim 17, wherein the alkylating agent is iodomethane or iodoethane.

19. A process for forming a photoresist pattern, comprising the steps of:

(a) coating a photoresist composition of claim 5, on a substrate to form a photoresist film;

(b) exposing the photoresist film to light by using an exposer; and (c) developing the exposed photoresist film.

20. The process according to claim 19, further comprising heating the photoresist film before and/or after said exposure step.

21. The process according to claim 20, wherein the photoresist film is heated to temperature in the range of from about 70° C. to about 200° C.

22. The process according to claim 19, wherein the exposer is a deep ultraviolet (DUV) light source selected from the group consisting of ArF, KrF, EUV, E-beam, beam, X-ray and ion beam.

23. The process according to claim 19, wherein said step of exposing the photoresist film comprises irradiating the photoresist film using the exposer at a light-exposure energy level of from about 1 mJ/cm$^2$ to about 100 mJ/cm$^2$.

24. A semiconductor element produced by the process according to claim 19.

* * * * *

UNITED STATES PATENT AND TRADEMARK OFFICE
CERTIFICATE OF CORRECTION

PATENT NO. : 6,399,272 B1
DATED : June 4, 2002
INVENTOR(S) : Geun Su Lee et al.

It is certified that error appears in the above-identified patent and that said Letters Patent is hereby corrected as shown below:

<u>Title page,</u>
Item [57], ABSTRACT, replace paragraph 1 with the following paragraph:

--The present invention relates to a phenylenediamine derivative of the formula:

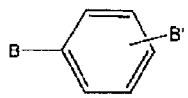

where B and B' are defined herein. The phenylenediamine derivatives of the present invention are useful as an additive in a photoresist composition. For example, it has been found that photoresist compositions comprising the phenylenediamine derivative of the present invention have a high energy latitude margin, an improved contrast value, and enhanced post exposure delay stability.--

Signed and Sealed this

Thirtieth Day of March, 2004

JON W. DUDAS
*Acting Director of the United States Patent and Trademark Office*